United States Patent [19]

Daniel et al.

[11] Patent Number: 4,551,788
[45] Date of Patent: Nov. 5, 1985

[54] MULTI-CHIP CARRIER ARRAY

[76] Inventors: Robert P. Daniel, 12932 Brittany Woods, Santa Ana, Calif. 92705; Larry Yglesia, 2301 Coco Palm, Tustin, Calif. 92680

[21] Appl. No.: 657,596

[22] Filed: Oct. 4, 1984

[51] Int. Cl.4 .............................................. H05K 1/02
[52] U.S. Cl. .................................. 361/403; 174/68.5; 361/406; 361/409
[58] Field of Search ........................ 361/400, 402–404, 361/406, 409, 410, 403; 324/73 PC; 174/68.5; 29/413

[56] References Cited

U.S. PATENT DOCUMENTS 3,436,605  4/1969  Landron, Jr. ........................ 361/403
4,467,400  8/1984  Stopper .............................. 361/403

OTHER PUBLICATIONS

Gyurk, "Break Apart Laminated Substrates", Western Electric Technical Digest No. 4, Oct. 1966, pp. 15 and 16.
Balde et al., "New Chip Carrier Concepts" Motorola Inc., EDN Sep. 1978, pp. 119–126.

Primary Examiner—R. R. Kucia
Assistant Examiner—Tarick Basma
Attorney, Agent, or Firm—Charmasson & Holz

[57] ABSTRACT

A multi-chip carrier array in which the individual carriers are defined by two perpendicular sets of parallel scribe lines which bisect the major axes of a plurality of equally-spaced oblong perforations. At the point of intersection of any two perpendicular scribe lines, the major axes of two such perforations intersect and bisect the right angles formed by said two perpendicular scribe lines. All other oblong perforations have their major axes perpendicular to the scribe lines. On the bottom surface of the array, metallic solder pads are located at opposite ends of each oblong perforation, and conductive material from each pad extends to the top surface of the array. Trace conductors on the top surface can be connected to these pad extensions. The trace conductors, in turn, will be connected to various connection points on an IC chip mounted in the center of the top surface of an individual carrier. Because the axis of any oblong perforation forms at least a half-right angle with its intersecting scribe line, the solder pads located at opposite ends of each oblong perforation can be separated by a gap sufficiently wide to permit electrical testing of the chips prior to the division of the array into discrete carriers and to prevent peeling of either the solder pads or the printed trace conductors on the opposite side when the array is divided.

3 Claims, 4 Drawing Figures

MULTI-CHIP CARRIER ARRAY

FIELD OF THE INVENTION

The present invention relates to multi-chip carrier arrays, and especially to those which allow the chips mounted on individual carriers to be tested prior to the array's division into separate carriers.

BACKGROUND OF THE INVENTION

With the development of integrated circuits and resulting miniaturization of complex electronic systems, it has been found practical to assemble integrated microcircuits (commonly referred to as "chips") on multi-chip carrier arrays. Such a carrier array typically consists of a thin sheet of ceramic or other non-conductive material on one surface of which individual rectangular carrier units are defined by means of two perpendicular sets of parallel scribe lines. The array is later divided along these scribe lines into individual carriers. In order to permit electrical feed through from one side of a carrier to the other, perforations are laser-machine along the scribe lines so that each carrier is surrounded about its perimeter by a number of perforations greater than or equal to the number of conductors which must be attached to the chip to be mounted on the carrier. The laser machining process generally results in oblong perforations having parallel sides along their length and somewhat rounded ends. Adjacent carriers share the the series of perforations machined along the shared scribe line segment. The perforations are line with conductive material and connect solder pads on one side of the carrier to trace conductors on the other, which in turn connect to various terminals on the chip.

The current generation of multi-chip carrier arrays suffers from two serious drawbacks. Both drawbacks stem from the fact that the oblong perforations, which are located about the periphery of each carrier and permit electrical conduction from one surface of a carrier to the opposite surface, have their major axes coincidental with the scribe lines. Given this orientation of the perforations, it is difficult to leave an insulating gap between the solder pads located on adjoining carriers on opposite sides of a perforation. Hence, it is also impossible to test an IC chip-carrier combination prior to division of the array into discrete carriers, since the majority of perforations would connect two lines from two unrelated chips. The lack of a gap between solder pads also contributes to a tendency of the solder pads and the printed trace conductors to peel away from the surface of the carrier once the array is divided.

SUMMARY OF THE INVENTION

In order to overcome the problems described in the previous section which are inherent in the multiple-chip carrier arrays which have the major axes of the oblong perforations coincidental with the scribe lines, the axes for all but the perforations located at the corners of the arrays have been rotated ninety degrees so that they are perpendicular to the scribe lines. The corner perforations are rotated only forty-five degrees. In this manner, the solder pads on one side of the array, and the printed trace conductors on the other side can easily be separated by an insulating gap, which not only allows simultaneous testing of all ICs mounted on the individual carriers prior to division of the array, but prevents the peeling of the metal solder pads and printed trace conductors once the array has been divided.

DESCRIPTION OF THE PREFERRED EMBODIMENT OF THE INVENTION

The multi-chip carrier array described hereinafter as the preferred embodiment of the invention is an array of carriers for 40 input-output integrated circuits. Carriers for ICs having any number of input-output lines may be manufactured in a like manner.

Figure 1:
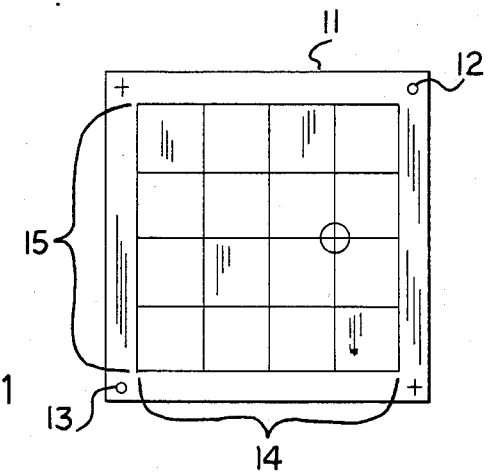
FIG. 1 is a top plan view of the multi-chip carrier array.
Figures 2, 4:
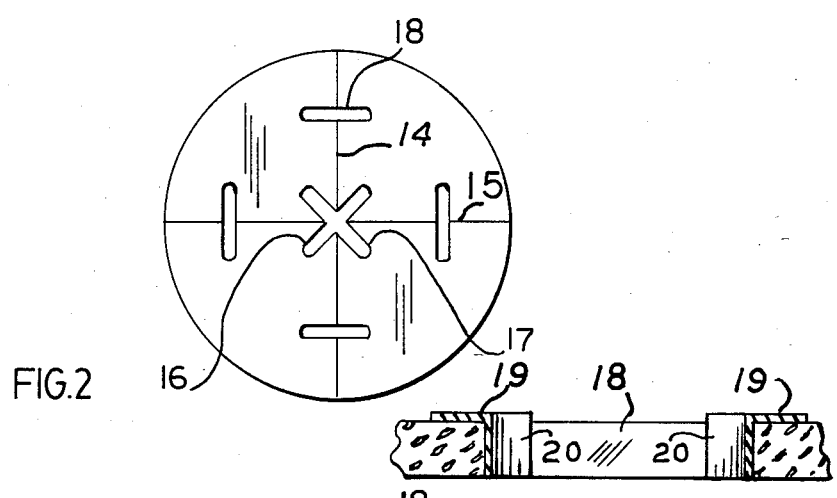
FIG. 2 is an enlarged top plan view of the circled section of FIG. 1.
FIG. 4 is a cross-sectional view of FIG. 3 taken through line 4—4.
Figure 3:
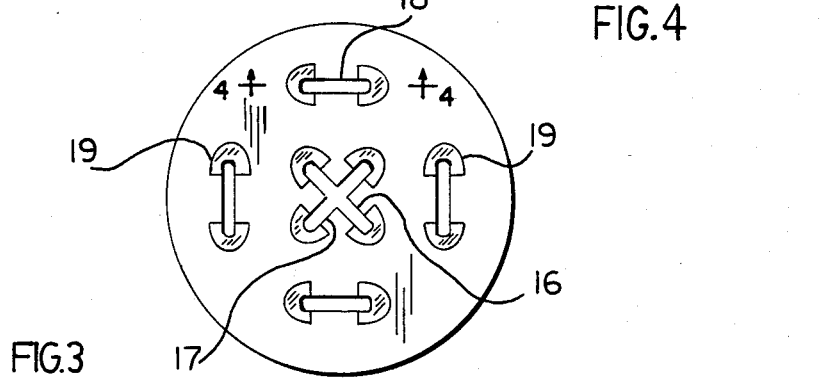
FIG. 3 is an enlarged bottom plan view of the circled section of FIG. 1.

The array is manufactured on a sheet of ceramic material 11 approximately 0.75 mm thick. For definitional purposes the top surface is the surface that will ultimately carry the IC chip. Two positioning holes 12 and 13 are located at opposite corners of the sheet 11. Two perpendicular sets of parallel scribe lines, 14 and 15, are laser machined on either surface of the sheet 11 to a depth of 0.250 to 0.375 mm, said scribe lines defining the individual carriers of the array. At the intersection point of each pair of perpendicular scribe lines, two intersecting oblong perforations 16 and 17, each having a length of 1.000 mm±0.025 mm and a width of 0.150 mm±0.025 mm are laser machined in the sheet so that the major axes of said intersecting oblong perforations bisect the four right angles formed by the intersection of the scribe lines. Nine oblong perforations 18, each having a length of 0.750 mm±0.025 mm and a width of 0.152 mm±0.025 mm are laser machined at uniform distances along each scribe line segment, so that each has its major axis perpendicular to and centered about the scribe line. On the bottom surface of the sheet, solder pads 19 are deposited at opposite ends of each perforation, with an insulating gap separating them. FIG. 4 shows feedthrough extensions 20 of the solder pads 19, which partially line the walls of the perforations, extending from the bottom surface to the top surface. Trace conductors, which connect to these pad extensions, can be deposited on the top surface of the array. The trace conductors, in turn, can be connected to various connection points on an IC chip mounted in the center of the top surface of an individual carrier. The insulating gap 21 between solder pads at opposite ends of a perforation permits IC chips mounted on any carrier to be electrically isolated from the ICs on adjacent carriers. When the array is later divided along the scribe lines, the gap between the solder pads prevents their peeling when the division is made.

While the preferred embodiment of the invention has been described, other embodiment may be devised and modifications may be made thereto without departing from the spirit of the invention and the scope of the appended claims. For example, the scribe lines are machined on one surface of the array in order to facilitate separation of the array into discrete carriers. Although the carrier array which constitutes the present invention is shown and described with the scribe lines on the top surface of the carrier array, they can just as easily be machined into the bottom surface. /

What is claimed is:

1. An improved multi-chip carrier array of the type having:
   a. individual carriers defined by two perpendicular sets of parallel lines scribed on either of the planar surfaces of a thin sheet of insulating material,
   b. a plurality of oblong feed-through perforations equally spaced about the perimeter of each carrier such that adjacent carriers share perforations along common borders, and
   c. solder pads located on one of said planar surfaces at the site of each oblong perforation,
   d. a feed-though extension of each pad, said extension being adhered to the perforation wall and extending to the surface of said sheet opposite that on which said pads are located, wherein the improvement comprises:

the major axes of all oblong perforations being bisected by at least one scribe line; and each oblong perforation having first and second solder pads positioned around its opposite ends on the same planar surface, each solder pad having a feed-through extension which extends to the other planar surface, said feed-through extensions being adhered to the perforation wall, and said first solder pad and associated feed-through extension being separated from said second solder pad and associated feed-through extension by an insulating gap.

2. The multi-chip carrier array of claim 1 wherein at the point of intersection of any two perpendicular scribe lines, the major axes of two oblong perforations bisect the right angles formed by said two scribe lines.

3. The multi-chip carrier array of claim 2 wherein the major axes of the remaining oblong perforations are perpendicular to and bisected by a single scribe line.

* * * * *